(12) United States Patent
Stiff

(10) Patent No.: US 7,265,633 B1
(45) Date of Patent: Sep. 4, 2007

(54) OPEN LOOP BANDWIDTH TEST ARCHITECTURE AND METHOD FOR PHASE LOCKED LOOP (PLL)

(75) Inventor: Jonathon Stiff, Beaverton, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 149 days.

(21) Appl. No.: 11/132,894

(22) Filed: May 19, 2005

Related U.S. Application Data

(60) Provisional application No. 60/579,944, filed on Jun. 14, 2004.

(51) Int. Cl.
*H03L 7/00* (2006.01)
*G01R 23/00* (2006.01)

(52) U.S. Cl. .......... 331/16; 331/18; 331/25; 331/1 A; 331/44; 327/157

(58) Field of Classification Search .......... 331/44, 331/8, 14, 1 A, 16, 17, DIG. 2, 25, 18; 324/76.53, 324/76.66, 76.68, 522; 327/156, 157
See application file for complete search history.

(56) References Cited

U.S. PATENT DOCUMENTS

| | | | |
|---|---|---|---|
| 3,810,036 A * | 5/1974 | Bloedom .......... 331/15 |
| 3,845,328 A * | 10/1974 | Hollingsworth .......... 326/58 |
| 4,980,652 A * | 12/1990 | Tarusawa et al. .......... 331/1 A |
| 5,206,582 A * | 4/1993 | Ekstedt et al. .......... 324/73.1 |
| 5,355,097 A | 10/1994 | Scott et al. |
| 5,684,434 A | 11/1997 | Mann et al. |
| 5,745,011 A | 4/1998 | Scott |
| 5,877,656 A | 3/1999 | Mann et al. |
| 6,008,703 A | 12/1999 | Perrott et al. |
| 6,380,811 B1 * | 4/2002 | Zarubinsky et al. .......... 331/18 |
| 6,433,645 B1 | 8/2002 | Mann et al. |
| 6,466,078 B1 | 10/2002 | Stiff |
| 6,625,765 B1 | 9/2003 | Krishnan |
| 6,670,852 B1 | 12/2003 | Hauck |
| 6,690,224 B1 | 2/2004 | Moore |
| 6,704,381 B1 | 3/2004 | Moyal et al. |
| 6,711,226 B1 | 3/2004 | Williams et al. |
| 6,744,323 B1 | 6/2004 | Moyal et al. |
| 6,753,739 B1 | 6/2004 | Mar et al. |
| 6,782,068 B1 | 8/2004 | Wilson et al. |
| 6,842,710 B1 | 1/2005 | Gehring et al. |
| 6,903,613 B1 | 6/2005 | Mitchell et al. |
| 6,911,857 B1 | 6/2005 | Stiff |
| 6,917,661 B1 | 7/2005 | Scott et al. |
| 6,949,984 B2 * | 9/2005 | Siniscalchi .......... 331/176 |

(Continued)

OTHER PUBLICATIONS

U.S. Appl. No. 60/678,397, Mohandas P. S.

*Primary Examiner*—Robert Pascal
*Assistant Examiner*—Ryan J Johnson
(74) *Attorney, Agent, or Firm*—Haverstock & Owens LLP

(57) ABSTRACT

A phase locked loop (PLL) can include a test loop filter (100) that generates a control voltage ($V_{CTRL}$) for input to a voltage controlled oscillator (VCO). In a test mode, a control voltage can be varied and resulting output frequencies recorded, from which an open loop bandwidth can be determined. A control voltage can be varied by enabling a switch element (104-1) that can provide a current path through load resistance (RL) of test loop filter (100). Current provided to the test loop filter can be varied according to test signals to provide a variable control voltage ($V_{CTRL}$).

20 Claims, 5 Drawing Sheets

U.S. PATENT DOCUMENTS 6,956,419 B1    10/2005  Mann et al.
6,980,060 B2 *  12/2005  Boerstler et al. ............. 331/17
7,030,688 B2 *   4/2006  Dosho et al. ............... 327/558
7,132,835 B1 *  11/2006  Arcus ......................... 324/523
2002/0149429 A1 *  10/2002  Sander ....................... 331/17
2003/0214360 A1 *  11/2003  Motoyoshi et al. ........... 331/16

* cited by examiner

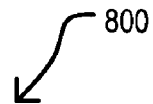

| Step # | Action |
|---|---|
| 1 | Place chip/part in tester. |
| 2 | Power up chip/part. |
| 3 | Place chip/part in test mode, program part:<br>1. Set $I_{UP}$ to "on"<br>2. Turn "on" M1 loop filter pull-down. |
| 4 | Program charge pump $I_{UP} = X * I_{REF}$ current. |
| 5 | Measure output frequency. Adjust the frequency measurement for any output frequency dividers not in the PLL loop. |
| 6 | Set to next X value, go to step 4 until the last X value. |
| 7 | Plot output frequency measurements as a function of X. |
| 8 | Perform a linear regression on the output frequency measurements to find the output frequency vs. X slope. This slope is $P_{SLOPE} = K_{VCO} * I_{REF} * (R_L + R_S)$. |
| 9 | The PLL open loop bandwidth for any particular X setting is:<br>$$OLBW = X/P \times P_{SLOPE} \times C_L/(C_L + C_S) \times R_L/(R_L + R_S)$$ |

FIG. 8

OPEN LOOP BANDWIDTH TEST ARCHITECTURE AND METHOD FOR PHASE LOCKED LOOP (PLL)

This application claims the benefit of U.S. Provisional Patent Application Ser. No. 60/579,944 filed on Jun. 14, 2004, the contents of which are incorporated by reference herein.

TECHNICAL FIELD

The present invention relates generally to electronic circuits, and more particularly to circuits that generate timing signals.

BACKGROUND OF THE INVENTION

In electronic systems, timing signals can be very important to the overall performance of the system. One widely used way to synchronize operations of a system (e.g., integrated circuit) with an externally received clock can be with a phase locked loop (PLL). PLLs can address many common timing problems associated with generating a clock signal, including but not limited to, unwanted clock skew and jitter. Of course, PLLs are widely in used in applications other than frequency synchronization, including but not limited to frequency synthesis, frequency translation, frequency detection, and frequency modulation.

To better understand various features of the disclosed embodiments, a conventional PLL arrangement will now be described with reference to FIG. 9.

FIG. 9 shows a block schematic diagram of a conventional third order PLL designated by the general reference character 900. FIG. 9 shows a basic "charge pump" style PLL, in which a charge pump generates a control (or error) voltage on a capacitance by "pumping" the potential up or down. Such a basic charge pump style PLL is commonly used for frequency synthesis applications.

A PLL 900 can include a phase frequency detector 902, charge pump 904, a loop filter (with passive components resistor $R_L$, capacitor $C_L$, and capacitor $C_S$) 906, a voltage controlled oscillator (VCO) 908, and a feedback divider 910. These blocks of a PLL 900 can form a negative feedback loop that operates to match the phases and frequencies of the two PFD input signals, $\phi_{IN}$ and $\phi_{FBK}$. A feedback divider 910 can allow the synthesized output signal to operate at "P" times the input frequency, thus enabling the PLL to generate an output signal $\phi_{OUT}$ in phase but greater in frequency than the reference input signal $\phi_{IN}$.

Because a PLL is a feedback loop, a loop frequency response can be important for determining the stability of the overall circuit. In order for a loop to be stable, the total loop phase shift must typically be less than 180 degrees when the open loop gain falls below 0 dB (at the open loop bandwidth).

In a basic charge pump PLL, the stable loop frequency range in the PLL can be far less variable over process and environmental conditions (due mostly to RC component variations of the loop filter) than the open loop bandwidth. Therefore, knowledge of the open loop bandwidth within the less variable stable loop frequency range can show the relative stability of the PLL. For example, if the open loop bandwidth is beyond the stable loop frequency range window, one can reasonably infer either instability or well under-damped stability.

Utilizing the transfer functions shown in FIG. 9, the PLL open loop bandwidth can be found as shown in Eq. 2.1.

$$OLG(s) = I_{CP} \times \frac{s\tau_L + 1}{s(C_L + C_S)(s\tau_S + 1)} \times \frac{K_{VCO}}{s} \times \frac{1}{P} \quad \text{Eq. 2.1}$$

where $$\tau_L = R_L C_L, \ \tau_S = \frac{C_L C_S}{C_L + C_S} R_L,$$

at $$OLG(s) \approx 0 \text{ dB},$$

$$OLG(s) = \frac{K_{VCO} I_{CP}}{P(C_L + C_S)} \times \frac{s\tau_L}{s^2} = \frac{K_{VCO} I_{CP} R_L C_L}{P(C_L + C_S)}$$

$$OLBW = K_{VCO} I_{CP} R_L \times \frac{C_L}{P(C_L + C_S)}$$

While measurement of PLL loop dynamics, including the open loop bandwidth, can provide insight into loop stability, such measurements are conventionally taken by bench and pico-probe testing whereby individual PLL component measurements are taken by an individual. Such methods present a more complex or invasive method than could be achieved through automated chip/part testing. As result, such approaches can be slow, inefficient, and expensive. Therefore, full PLL testing, which includes the open loop bandwidth measurement, is typically only completed on a small sample set of any particular PLL chip/part taken from a much larger manufacturing lot or group of devices.

Conventional PLL test measurements taken during production typically include only a "lock" test, which can reveal PLL stability in a binary sense (true/false), but reveals no other information about the PLL loop dynamics.

In light of the above, it would be desirable to have a test mechanism for testing PLL loop dynamics that can be more easily and inexpensively implemented than conventional approaches, such as bench testing.

SUMMARY OF THE INVENTION

The present invention can include a phase locked loop (PLL) circuit that includes a test loop filter. A test loop filter can include a resistor-capacitor (RC) network coupled to a control node. A control can be coupled to a voltage controlled oscillator (VCO). The test loop filter can also incorporate a test leg coupled to the RC network that includes a test resistance, and at least one test controllable impedance path in series with the test resistance. The test leg can provide a high impedance in a non-test mode and a low impedance in a test mode.

In a test mode, a current can be caused to flow through a loop filter resistance to thereby generate a voltage at the control node that can be controlled in order to test PLL circuit parameters.

According to one aspect of the embodiments, a test controllable impedance path can comprise a transistor. In such an arrangement, test capabilities can be added to an existing PLL circuit design with the addition of only a few circuit components.

According to another aspect of the embodiments, an RC network can include a load resistance and a first filter capacitor in series with one another between the control node and a first power supply node. A test leg can be coupled in series with the load resistance and in parallel with the first filter capacitor. More particularly, a load resistance can be coupled to the first filter capacitor at a filter node, and the test leg can include a test resistance coupled to the first filter node and the test controllable impedance path coupled between test resistance and the first power supply node.

According to another aspect of the embodiments, a test leg can further include an offset voltage circuit coupled in series with a test resistance.

According to another aspect of the embodiments, a test resistance can be a variable resistance that is varied in the test mode. In this way, different control voltages can be generated based on resistance values, as opposed to a varying test current value.

According to another aspect of the embodiments, a PLL circuit can further include an adjustable current supply that provides a selectable current to the control node in the test mode. In this way, different control voltages can be generated based on a test current value provided to a test loop filter. In one advantageous arrangement, an adjustable current supply can be an existing section of a charge pump circuit that provides a current supply based on a phase difference signal in the non-test mode.

According to another aspect of the embodiments, a PLL circuit can further include a phase detector circuit that provides a phase difference value. In a test mode, the phase difference value can vary according to test input values. In a non-test mode, the phase difference value can be based a difference between an input signal and feedback signal. A charge pump circuit can be coupled to the control node and provide a current to the control node based on the phase difference value output from the phase detector circuit. In this way, different control voltages can be generated based on a test values provided to a phase detector circuit.

According to another aspect of the embodiments, a PLL circuit can further include a phase detector that generates a phase different value based on a phase difference between an input signal and a feedback signal. A charge pump can be coupled between the phase detector and control node that provides a current to the control node based on the phase difference value. In addition, a feedback path can be coupled between an output of the VCO and an input of the phase detector. The feedback path can include a loop switch that opens the feedback path in the test mode and remains closed in a non-test mode. In this way, different control voltages can be generated based on opening a feedback path of the PLL circuit.

According to another aspect of the embodiments, the loop filter is formed in the same integrated circuit substrate as other portions of the PLL. In such an arrangement, a PLL manufactured as an integrated or as a portion of an integrated circuit can be easily tested for an open loop bandwidth value.

The present invention can also include a method of testing a PLL circuit. The method can include enabling a test leg that draws current through a load resistance of a PLL loop filter to generate a control voltage at an input of a voltage controlled oscillator. The method can also include varying the control voltage and measuring the output frequency of the PLL for each of the different control voltages. Such a method can help arrive at an open loop bandwidth determination for a PLL without invasive or time consuming testing.

According to one aspect of the embodiments, a PLL circuit can be formed in an integrated circuit. Further, enabling the test leg comprises turning on a transistor in response to a test signal applied from a source external to the integrated circuit.

According to another aspect of the embodiments, varying a control voltage can include providing a first test current of magnitude "I" to generate one control voltage, and providing currents having a multiple of "I" to generate a plurality of other control voltages.

According to another aspect of the embodiments, varying a control voltage can include outputting predetermined different phase difference values from a phase detector and generating test currents in response to each different phase difference value. Such test currents can be provided to the loop filter.

According to another aspect of the embodiments, varying a control voltage can include opening a feedback loop of the PLL.

According to another aspect of the embodiments, a method can further include performing a linear regression on output frequency measurements and corresponding values used to vary the control voltage.

The present invention can also include a PLL having a test loop filter that includes a load resistor coupled to a control voltage node and a test leg that provides a current path through the load resistor that is disabled in a non-test mode and enabled in a test mode. The PLL can also include a voltage controlled oscillator coupled to the test loop filter that generates an output signal having a frequency determined, at least in part, on a voltage generated on the control voltage node.

According to another aspect of the embodiments, a test loop filter can include a load resistor coupled in series with a first load capacitor, and a switch element coupled between the load resistor and a power supply node.

According to another aspect of the embodiments, a PLL can further include a variable supply current circuit that provides an output current to the test loop filter that has a magnitude that can be varied in response to test signals in the test mode.

BRIEF DESCRIPTION OF THE DRAWINGS

FIG. 8 is a table showing a test method according to an embodiment of the present invention.

DETAILED DESCRIPTION

Various embodiments of the present invention will now be described in detail with reference to a number of drawings. The embodiments include a loop filter circuit, phase locked loop (PLL) circuit, and test method that can arrive at an open loop gain measurement for a PLL circuit that may be less invasive, faster, and simpler than conventional approaches.

Figure 1:
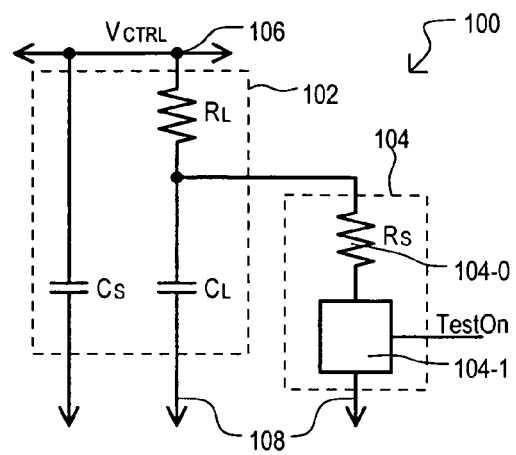
FIG. 1 is a block schematic diagram of a first embodiment of the present invention.

A first embodiment of the present invention can include a test loop filter of a PLL circuit. A test loop filter is designated by the general reference character 100, and can include a resistor-capacitor (RC) network 102 and a test leg 104. An RC network 102 can be situated between a control node 106 and a supply node 108 (in this case a low voltage power supply node, such as ground). In the very particular example of FIG. 1, RC network 102 can include a load resistance RL, a first capacitor CL, and a second capacitor CS. A load resistance RL can be connected in series with first capacitor CL between a control node 106 and supply node 108. A second capacitor CS can be connected in parallel with load resistor RL and first capacitor CL between control node 106 and supply node 108.

A test leg 104 can be connected to a load resistance RL, and when enabled, can provide a current path through load resistance RL. In the very particular example shown in FIG. 1, a test leg 104 can include a test resistance RS 104-0 arranged in series with a switch element 1041. Test resistance RS 104-0 can be connected at a node that joins load resistance RL with first capacitor CL. A switch element 104-1 can provide an impedance path that is controllable in response to a signal TestOn. Thus, when signal TestOn has one value, switch element 104-1 can provide a low impedance path. However, when signal TestOn has another value, switch element 104-1 can provide a high impedance path. It is understood that the particular order of circuit elements within test leg 104 should not be construed as limiting to the invention (i.e., a switch element 104-1 can be connected between a load resistance RL and test resistance RS 104-0).

Figure 9:
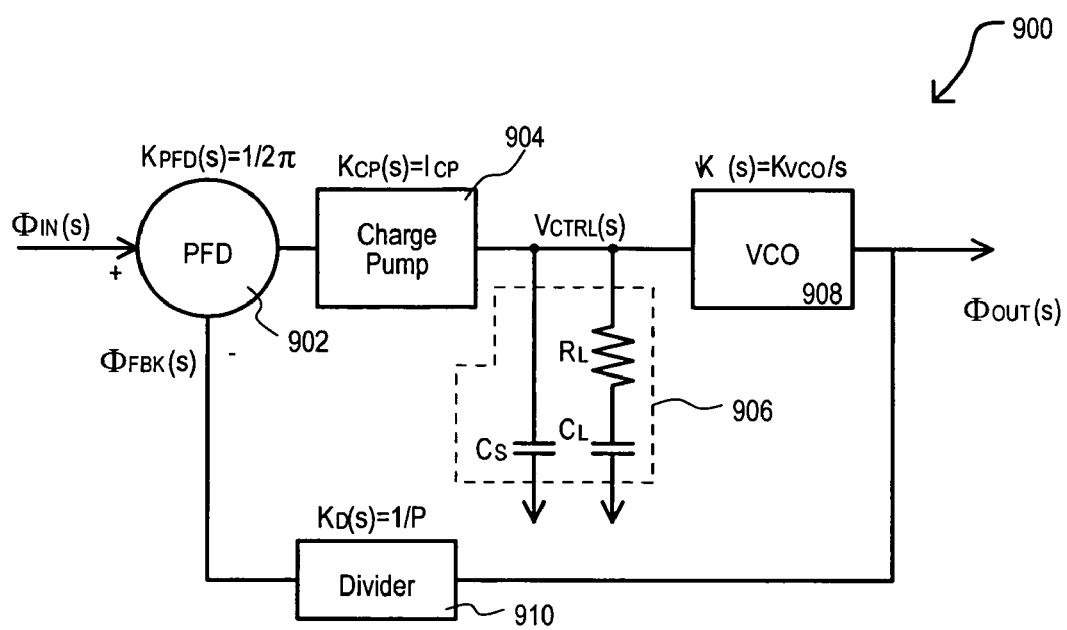
FIG. 9 is a block schematic diagram of a conventional phase locked loop circuit.

Accordingly, in a non-test mode, switch element 104-1 can provide a high impedance and RC network 102 can operate in the same essential way as conventional loop filter 906 shown in FIG. 9, generating a control voltage $V_{CTRL}$ at control node 106 due to the total charge delivered during by a PLL charge pump during acquisition and lock.

In contrast, in a test mode, switch element 104-1 can provide a low impedance. Consequently, loop filter 100 can provide a control voltage $V_{CTRL}$ that corresponds to the current flowing through load resistance RL and test resistance RS. This can enable the acquisition of test data for measuring the open loop gain for a PLL circuit containing the loop filter 100. More details and examples of such measurements will be described below.

Figure 2:
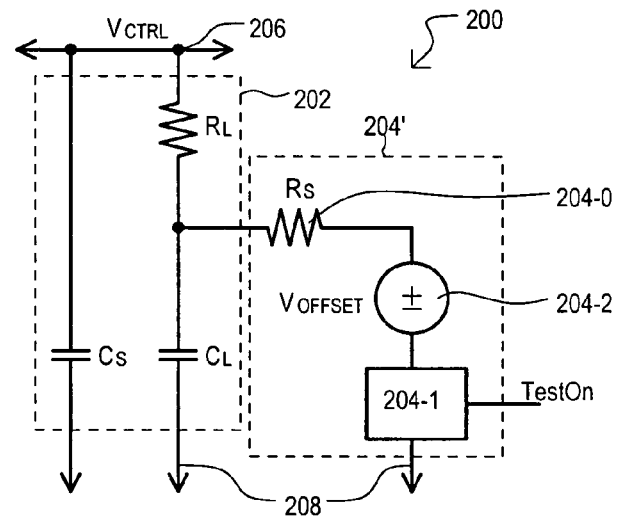
FIG. 2 is a block schematic diagram of a second embodiment of the present invention.

FIG. 2 shows a second embodiment of a loop filter, designated by the general reference character 200. A second embodiment 200 can include some of the same circuit components as the first embodiment 100. Thus, like components are referred to by the same reference character but with the first digit begin a "2" instead of a "1".

A second embodiment loop filter 200 can differ from the first embodiment in that a test leg 204' may also include an offset voltage circuit 204-2. An offset voltage circuit 204-2 can introduce an offset voltage component $V_{OFFSET}$ to a control voltage $V_{CTRL}$.

Figure 3:
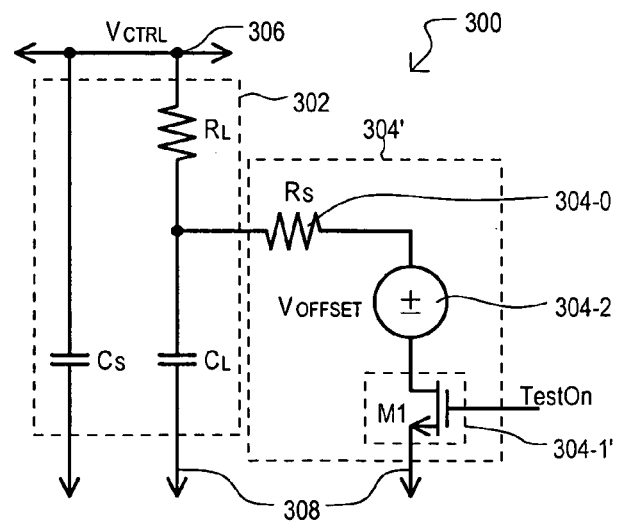
FIG. 3 is a block schematic diagram of a third embodiment of the present invention.

FIG. 3 shows a third embodiment of a loop filter, designated by the general reference character 300. A third embodiment 300 can include some of the same circuit components as the second embodiment 200. Thus, like components are referred to by the same reference character but with the first digit begin a "3" instead of a "2".

A third embodiment loop filter 300 can differ from the second and first embodiments in that a switch element 304-1' can include a insulated gate field effect transistor (e.g., a pull-down MOSFET M1) having a source-drain path coupled between a load resistance RL and a power supply voltage node 308, and a gate that receives a signal TestOn.

It is understood that a loop filter, with added components of a test leg, can preferably be formed in the same substrate that contains the corresponding PLL circuit. In such an arrangement, test capabilities can be introduced into a PLL circuit by adding only a few additional circuit components to an existing PLL circuit design.

As noted above, in determining an open loop gain value, a current provided to a loop filter can be adjusted, or otherwise selected by a testing device and/user. More particularly, when a switch element (e.g., the pull-down MOSFET M1) is turned "on," current can flow through a load resistor $R_L$. Voltage can be generated across $R_L$ by forcing a charge pump UP current ($I_{UP}$) "on." An UP current, $I_{UP}$, can be forced "on" using a number of techniques, a few of which are illustrated below in FIGS. 4 to 6.

Most, if not all, charge pump PLLs can have a built in charge pump current varying capability where the value is changed by X times a reference value $I_{REF}$ (where X can take a number of values greater than one). In a test mode, a charge pump value can be alterable by external part pin programming (using any common method via a part tester). As will be described in more detail below, by varying $I_{UP}=X*I_{REF}$ over several values, a PLL open loop gain value can be derived from the resulting data.

Figure 4:
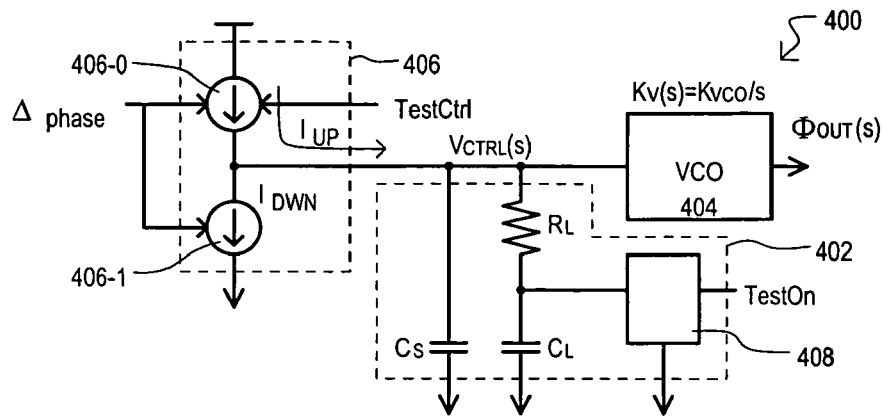
FIG. 4 is a block schematic diagram of a fourth embodiment of the present invention.

FIG. 4 shows a block schematic diagram of a PLL circuit section according to a fourth embodiment. A PLL circuit section is designated by the general reference character 400 can include a test loop filter 402, voltage controlled oscillator (VCO) 404, and charge pump circuit 406. A test loop filter 402 can take the form of any of the above embodiments or equivalents, and can provide a control voltage $V_{CTRL}$ that depends upon a current provided to loop filter 402 from charge pump circuit 406. A VCO 404 can generate an output signal $\Phi_{OUT}$ having a frequency that depends upon control voltage $V_{CTRL}$.

FIG. 4 illustrates a case in which a current $I_{UP}$ provided to a test loop filter 402 during a test can be generated by additional current switching in the charge pump 404. More particularly, a charge pump 404 may provide a current $I_{UP}$ from a controllable current source 406-0 to a loop filter 402 according to test value TestCtrl.

In a non-test mode, current $I_{UP}$ can be based on a phase difference value Δphase generated by a phase detector circuit, or the like. In this way, capacitors (i.e., CS and CL) within loop filter 402 can be charged up to create a larger control voltage $V_{CTRL}$ when a phase difference exist (e.g., lag or lead), and thereby increase the frequency of VCO output signal $\Phi_{OUT}$. A charge pump 404 may optionally include another controllable current source (or discharge path) 406-1 that discharges capacitors (i.e., CS and CL) within loop filter 402 to decrease control voltage $V_{CTRL}$ when an opposite phase difference exist (e.g., lead or lag), and thereby decrease the frequency of VCO output signal $\Phi_{OUT}$.

However, in a test mode, and unlike conventional operations, a current $I_{UP}$ can be based on a test established value TestCtrl. In this way, a control voltage $V_{CTRL}$ can be generated that is based on a voltage generated across load resistance RL and any test resistance (and/or offset voltage) present in a test leg 408, rather than on charged capacitors. A value of current $I_{UP}$ can be varied to generate multiple data points, each corresponding to a different current value $I_{UP}$ (or control voltage value $I_{UP}$ can). Preferably, the values of current $I_{UP}$ can include a reference current $I_{REF}$ and a number of multiples of the reference current $X*I_{REF}$ (where 1<X<N, and N is an integer greater than 2).

In this way, charge pump current switching can be used to provide different current levels to a test loop filter in a test mode.

While it may particularly advantageous to generate varying values for a current $I_{UP}$ using built-in capabilities of charge pump, it may be possible to generate such values according to alternate ways, two of which are set forth below.

Figure 5:
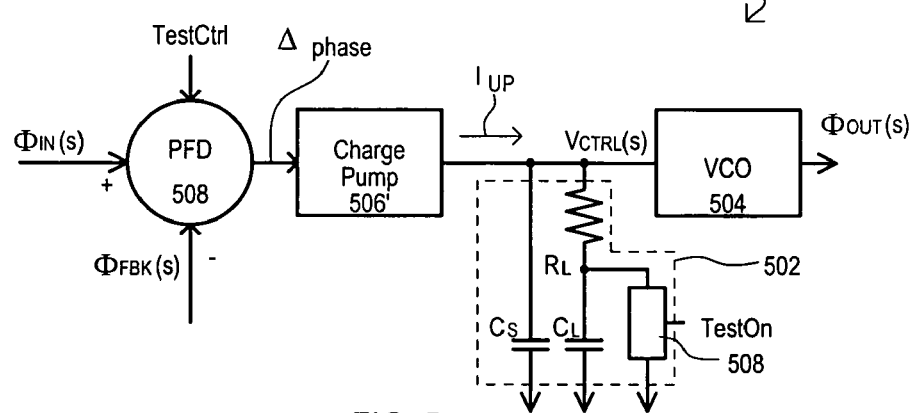
FIG. 5 is a block schematic diagram of a fifth embodiment of the present invention.

FIG. 5 shows a block schematic diagram of a PLL circuit section according to a fifth embodiment. A PLL circuit section is designated by the general reference character 500 can include some of the same general components as the embodiment of FIG. 4. Thus, like components are referred to by the same reference character but with the first digit begin a "5" instead of a "4".

A PLL circuit section 500 can differ from that of FIG. 4 in that a charge pump 506' can be conventional in design, and not provide additional current switching in a test mode. Further, a PLL circuit section 500 can also include an adjustable phase detector (PFD) 508. An adjustable PFD 508 can include additional logic over a conventional PFD that enables the adjustable PFD 508 to generate a phase difference value that does not only depend upon a difference between an input signal and feedback signal.

In a non-test mode, a phase difference value Δphase can be generated by a PDF 508 based on a phase difference between an input signal $\Phi_{IN}$ and a feedback signal $\Phi_{FBK}$. In response to such a phase difference, a charge pump 506' can provide a current $I_{UP}$ (and optionally $I_{DWN}$) to test loop filter 508. That is, the PLL circuit section 500 operates in a conventional fashion.

However, in a test mode, and unlike conventional operations, a phase difference value Δphase can be based on a test established value TestCtrl. In this way, a control voltage $V_{CTRL}$ can be generated that is based on a voltage generated across load resistance RL and any test resistance (and/or offset voltage) present in a test leg 508, rather than on charged capacitors. A phase difference value can be varied to generate various data points, as noted above in the description of the fourth embodiment.

In this way, phase detector output can be used to provide different current levels to a test loop filter in a test mode.

Figure 6:
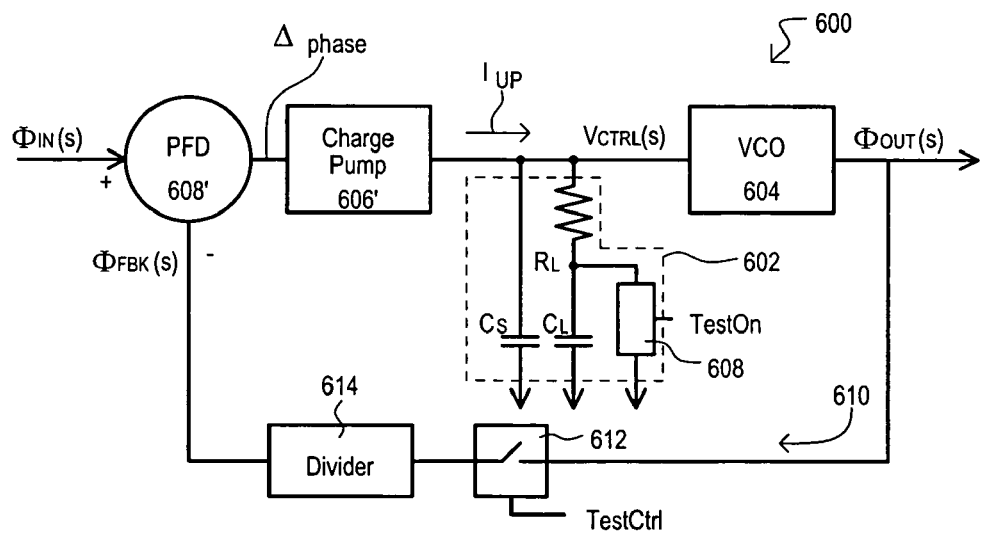
FIG. 6 is a block schematic diagram of a sixth embodiment of the present invention.

FIG. 6 shows a block schematic diagram of a PLL circuit section according to a sixth embodiment. A PLL circuit is designated by the general reference character 600 can include some of the same general components as the embodiment of FIG. 5. Thus, like components are referred to by the same reference character but with the first digit begin a "6" instead of a "5".

A PLL circuit 600 can differ from that of FIG. 5 in that a phase detector circuit 608' can be conventional in design, and not provide a test selectable phase difference value Δphase. In addition, a PLL circuit section 600 can include a feedback path 610 that can feed back a signal from VCO 604 to PFD 608'. A feedback path 610 can include a loop switch element 612 and, optionally, a frequency divider 614.

FIG. 6 illustrates a case in which a test current $I_{UP}$ provided to a test loop filter 602 during a test can be generated by opening feedback path 610.

In a non-test mode, loop switch element 612 provides a low impedance, enabling feedback path 610 and thereby providing a feedback signal $\Phi_{FBK}$ to PFD 608. This completes a negative feedback loop that forces feedback signal $\Phi_{FBK}$ to match input signal $\Phi_{IN}$.

However, in a test mode, and unlike conventional operations, a loop switch element 612 can provide a high impedance path that disables feedback path 610. This opens the negative feedback loop of the PLL circuit. In such a case, PDF 608' can generate a phase difference value Δphase that causes charge pump 606' to provide a current $I_{UP}$ to test loop filter 602. In this way, a control voltage $V_{CTRL}$ can be generated that is based on a voltage generated across load resistance RL and any test resistance (and/or offset voltage) present in a test leg 508, rather than on charged capacitors. A phase difference value can be varied to generate various data points, as noted above in the description of the fourth embodiment. As but one very particular example, multiple phase difference values can be generated by opening a feedback loop for different amounts of time.

In this way, a feedback loop can be opened to provide different current levels to a test loop filter in a test mode.

Referring back to FIG. 3, a general method for determining an open loop gain for a PLL circuit will now be described. As will be recalled, in a test mode a switch element (e.g., transistor M1) can be turned on. In the particular example of FIG. 3, in series with transistor M1 can be an optional voltage offset, $V_{OFFSET}$, which increases/decreases the $V_{CTRL}$ voltage from the $R_L$ voltage and an optional series resistor $R_S$, resulting in the following relationship:

$$V_{CTRL}=I_{UP}(R_L+R_S)+V_{OFFSET}.$$

From the $V_{CTRL}$, a VCO can generate an output frequency determined by the following Eq. 4.1.

$$F_{OUT}=K_{VCO}*V_{CTRL}+F_{OFFSET} \qquad \text{Eq. 4.1}$$

Substituting in the value of $V_{CTRL}$, one can obtain Eq. 4.2, which shows the relationship:

$$F_{OUT}=K_{VCO}*(I_{UP}[R_L+R_S]+V_{OFFSET})+F_{OFFSET} \qquad \text{Eq. 4.2}$$

where $F_{OUT}$ is the frequency of a signal output from a VCO, $K_{VCO}$ is the VCO frequency vs. control voltage transfer function, $I_{UP}$ is a current provided to a test loop filter (e.g., from a charge pump, or the like), $R_L$ is a load resistance, $R_S$ is a test resistance, $V_{OFFSET}$ is the offset voltage, and $F_{OFFSET}$ is an inherent VCO frequency offset.

After further simplification where the fixed offsets are separated from the rest of the equation, it can be seen that the change in frequency is dominated by the important PLL terms.

$$F_{OUT}=K_{VCO}I_{UP}(R_L+R_S)+(K_{VCO}V_{OFFSET}+F_{OFFSET}) \qquad \text{Eq. 4.3}$$

By varying $I_{UP}=X*I_{REF}$ over several values, one can separate out the constant offset terms and arrive at $K_{VCO}I_{UP}(R_L+R_S)$. This value is important because it nearly comprises the equation for a $3^{rd}$ order charge pump PLLs open loop bandwidth (OLBW), as shown in Eq. 4.4.

$$OLBW = K_{VCO}I_{CP}R_L \times \frac{C_L}{P(C_L+C_S)} \qquad \text{Eq. 4.4}$$

The remaining loop filter capacitor and resistor ratio and feedback divider terms can be fixed quantities that are determined in the design and do not change significantly with process variation. Therefore, this measurement can arrive at a PLL open loop bandwidth measurement, which as note above, can indicate PLL stability and can be used to estimate its closed loop bandwidth.

Figure 7A:
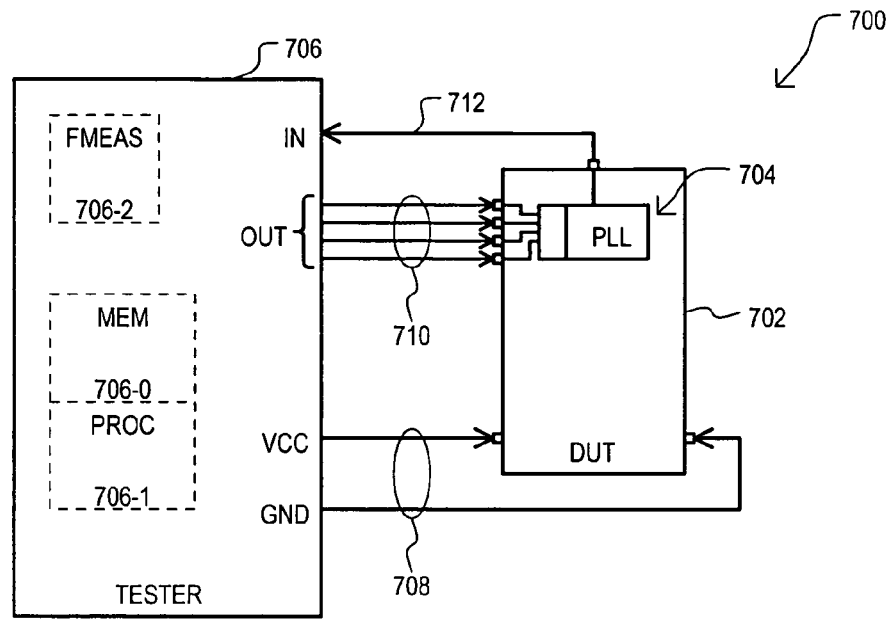
FIG. 7A is a block schematic diagram of a testing arrangement according to an embodiment of the present invention.
Figure 7B:
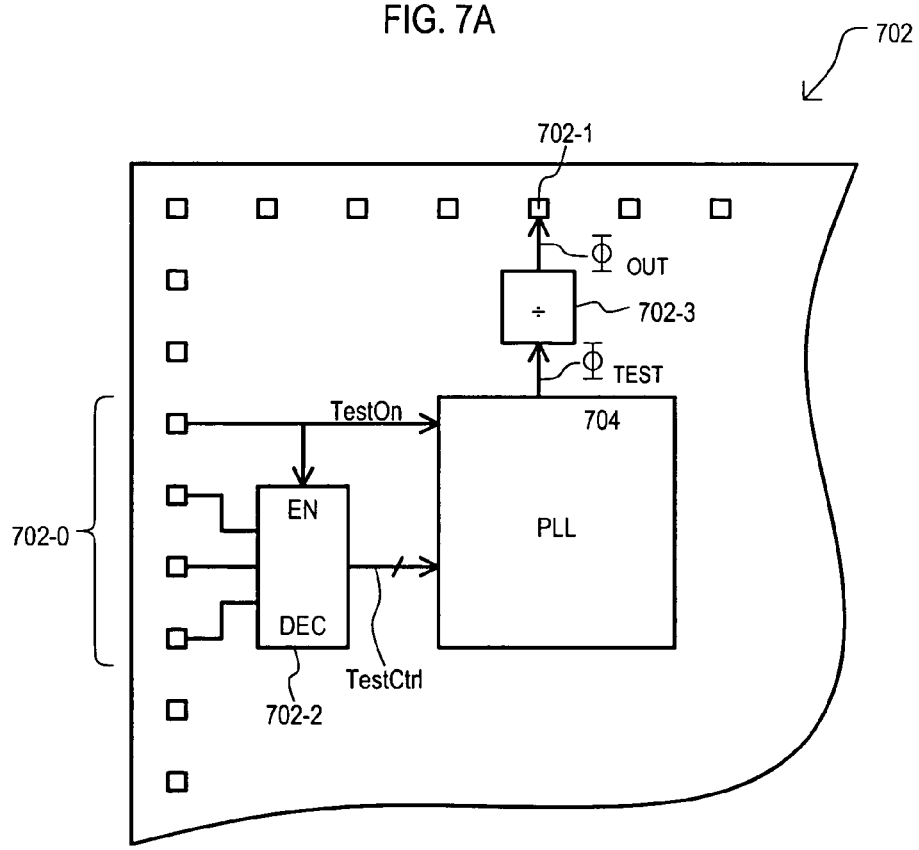
FIG. 7B is a block diagram of one example of a device under test like that shown in FIG. 7A.

Testing according to the above embodiments can be advantageously accomplished without invasive or time consuming probing. An embodiment illustrating such an arrangement is shown in FIGS. 7A and 7B. An overall testing system is shown in FIG. 7A and designated by the general reference character 700. A testing system 700 can include a device under test (DUT) 702, which can be an integrated circuit in which is formed a PLL circuit 704. A PLL circuit 704 that may include any of the above embodiments, or equivalents.

A tester 706 can apply test signals to a DUT 702 in a conventional fashion, such as at package pins, bond pads or test pads. In the very particular example of FIG. 7A, a tester 706 can provide power (e.g., VCC and ground) to bond pads via power outputs 708, test control signals via one or more test control outputs 710, and receive an output signal via a test input 712.

In the very particular example of FIG. 7A, a tester 706 can include memory 706-0 for storing a test program for execution by a processor 706-1. In addition, a tester 706 can include a frequency measuring circuit 706-2.

It is understood that a tester 706 can be connected to a DUT 702 by conventional tester connections, including but not limited to socket connections that hold a DUT 702 in the form of a packaged integrated circuit, or probes (electrically connected to bond pads and/or test pads) in the case of a DUT 702 that is unpackaged (i.e., in die, or multi-die form).

In this way, according to an embodiment, test connections for a PLL open loop bandwidth test can be made in a conventional tester fashion, which is far less complex and invasive than conventional bench testing.

FIG. 7B shows a more detailed example of one particular DUT 702 example. A DUT 702 can include a PLL circuit 704 as noted above, and in addition, a number of test inputs 702-0 and one or more test outputs 702-1. Such test inputs and outputs can take numerous forms, including but not limited to device package pins, bond pads, or test pads.

In very particular example of FIG. 7B, test inputs can provide a TestOn signal (described in more detail above), as well as one or more inputs to a test decoder 702-2. A test decoder 702-2 can decode test signals to generate test control values TestCtrl (also described above). Still further, the test arrangement of FIG. 7B an optionally include an output frequency divider 702-3. An output frequency divider 702-3 can frequency divide an output frequency of a VCO $\Phi_{OUT}$ to generate a signal of a lower frequency $\Phi_{TEST}$ in the event such a value is more readily processed by a tester. Such a divider can be an existing divider within a PLL (e.g., one in the feedback loop), or an additional divider included on the DUT 702 or in a tester, as but a few examples.

Further, while the arrangement of FIGS. 7A and 7B shows a testing arrangement in which a tester directly measures a frequency, it is understood that a frequency measurement can include various indirect measurements. As but one of the many possible examples, a DUT can include a counter enabled and reset by a tester. A tester can read count values from the counter generated in a set period of time to thereby determine a frequency.

While the present invention has been described in terms of circuits and test systems, the present invention may also include test methods for PLLs and devices that include PLLs. One example of a method according to an embodiment is shown in FIG. 8. FIG. 8 is a table illustrating various steps for measuring a PLL open loop bandwidth (OLBW).

A method 800 can include placing a chip/part in a tester (step 1). As but a few examples, such a step can include placing a packaged part in a tester socket and/or applying probes to an individual die and/or die of a wafer. Power can then be applied to the device under test (e.g., chip/part) (step 2).

A DUT can then be placed into a test mode and a test features within the PLL can be enabled. Such a step can include various conventional approaches, including but not limited to, applying a predetermined potential to one or more pins/pads and/or entering a predetermined command to a DUT. Once a test mode has been entered, an initial test current value $I_{UP}$ can be set. This may be accomplished by any of the various approaches noted above, and equivalents. Further, a current path may be enabled that includes the load resistance (RL) of a PLL loop filter. The very particular example of FIG. 8 follows the structure shown in FIG. 3. Accordingly, step 3 can also include turning on transistor M1.

Method 800 can also include programming $I_{UP}$ to some initial value. In the particular example shown, this step (step 4) includes programming a current value to the following: $I_{UP}=X*I_{REF}$, where X is a selectable value.

Once an initial test current is flowing through the PLL loop filter, a frequency can be measured. In FIG. 8 this can include adjusting for any frequency dividers not in the PLL loop (step 5).

A method 800 can then continue to take more data point measurements by varying the value of X and repeating the previous steps (step 6).

Data values acquired for different values of X can then be accumulated. For example, such data values can be stored in a memory, or, as in the very particular example of FIG. 8, plotted out (step 7).

Once multiple data values are accumulated, a slope can be calculated for the data set. Such a step can include executing a linear regression on the data values set to arrive at a slope. Such a slope can represent the value $P_{SLOPE}=K_{VCO}*I_{REF}*$ (RL+RS), where $P_{SLOPE}$ is the calculated slope, $K_{VCO}$ is the gain of the PLL VCO, RL is a loop filter load resistance as described above, and RS is a test resistance as described above (step 8).

From such a slope value, a PLL open loop bandwidth for any particular X setting can be given by:

$$OLBW = \frac{X}{P} \times P_{SLOPE} \times \frac{C_L}{(C_L + C_S)} \times \frac{R_L}{(R_L + R_S)}$$

where P is a divider value of a divider in a feedback loop, CL is a first loop filter capacitance as noted above, and CS is a second loop filter capacitance as noted above.

In this way, an open loop bandwidth can be calculated for a PLL without invasive testing and relatively simple calculation steps.

The above embodiments provide a novel embedded PLL test arrangement that can avoid the complicated and/or invasive techniques required by conventional bench measurements. Utilizing any of the various embodiments, an automated tester can complete the measurement(s) needed to arrive at an open loop bandwidth value during die and/or packaged part testing. Therefore, instead of testing only a few devices to characterize or qualify a group or family of parts, all, or a significantly larger number of parts can be tested. The data generated can be either used to selectively group parts (commonly known as binning) or as a pass/fail check.

In addition, the above described embodiments can be useful in that the additional circuit components are small and easily added to an existing PLL circuit. Further, because the measurement may only require part pin programming and frequency measurement ability (something any generic PLL/clock part tester can accomplish), it can offer low cost testing. In addition, the data generated by the test can reveal statistically relevant information about the PLL performance over entire part productions, which could be applied to enhance further design or to confirm or improve part specifications.

As mentioned above, in one exemplary embodiment the PLL open loop bandwidth data could be utilized to separate devices having PLLs into different product bins, for example during device manufacturing and testing. In one instance, the higher bandwidth PLLs parts for a device (e.g., zero delay buffer clock) could have greater value in the marketplace due to the enhanced performance such a high PLL bandwidth provides. Application of the open loop bandwidth data could also be used to check PLL stability for a pass/fail verification test. One skilled in the art would recognize that many other applications are possible, thus the uses are not limited to the examples given above.

It is understood that the above embodiments represent but particular examples of the present invention and should not be construed as limiting to the invention. As but a few of the many alternate embodiments, MOSFETs included in the improved circuit shown could also be replaced with bipolar transistors, or junction FETs. A complementary solution could also be implemented by switching NMOS and PMOS as well as the positive power supply and the negative power supply.

In a yet another alternate embodiment, a loop filter resistance value could also be varied in order to generate different $V_{CTRL}$ values from which the same PLL open loop information could be extracted. More particularly, a load resistance RL could be composed of a number of resistances arranged in series and or parallel, where such resistances can be switched into or out of a current path according to test signals. Such a method, however, may not be as precise as the indicated method since $X*I_{REF}$ (due to current mirroring) can be more precise in actual application than $RL=X*R_{REF}$ (from resistor switching) and would, therefore, could have greater error.

Along these same lines, while one particular method is shown in FIG. 8, the listed test procedure steps do not have to be executed precisely as indicated in the figure. Alternate embodiments could have different ways for acquiring an output frequency value for all $I_{UP}$ and R conditions. Once such steps are completed, an open loop bandwidth can be calculated.

For purposes of clarity, many of the details of (subject matter) and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that other embodiments of this invention may be practiced in the absence of an element/step not specifically disclosed herein.

Accordingly, while the various aspects of the particular embodiments set forth herein have been described in detail, the present invention could be subject to various changes, substitutions, and alterations without departing from the spirit and scope of the invention.

The invention claimed is:

1. A phase locked loop (PLL) circuit, comprising:
a test loop filter, comprising
a resistor-capacitor (RC) network coupled to a control node coupled to a voltage controlled oscillator (VCO), and
a test leg coupled to the RC network that includes a test resistance, and at least one test controllable impedance path in series with the test resistance that provides a high impedance in a non-test mode and a low impedance in a test mode.

2. The PLL circuit of claim 1, wherein:
the test controllable impedance path comprises a transistor.

3. The PLL circuit of claim 1, wherein:
is the RC network comprises a load resistance and a first filter capacitor in series with the load resistance between the control node and the first power supply node; and
the test leg is coupled in series with the load resistance and in parallel with the first filter capacitor.

4. The PLL circuit of claim 3, wherein:
the load resistance is coupled to the first filter capacitor at a filter node; and
the test leg includes the test resistance coupled to the first filter node and the test controllable impedance path is coupled between the test resistance and a first power supply node.

5. The PLL circuit of claim 1, wherein:
the test leg further includes an offset voltage circuit coupled in series with the test resistance and test controllable impedance path.

6. The PLL circuit of claim 1, wherein:
the test resistance is a variable resistance that is varied in the test mode.

7. The PLL circuit of claim 1, further including:
an adjustable current supply that provides a selectable current to the control node in the test mode.

8. The PLL circuit of claim 7, wherein:
the adjustable current supply comprises part of a charge pump circuit that provides a current supply based on a phase difference signal in the non-test mode.

9. The PLL circuit of claim 1, further including:
a phase detector circuit that provides a phase difference value that is variable according to test input values in the test mode, and a phase difference value that is based on an input signal and feedback signal that is different from the test input values in the non-test mode; and a charge pump circuit coupled to the control node that provides a current to the control node based on the phase difference value output from the phase detector circuit.

10. The PLL circuit of claim 1, further including:

a phase detector that generates a phase difference value based on a phase difference between an input signal and a feedback signal;

a charge pump coupled between the phase detector and control node that provides a current to the control node based on the phase difference value;

the VCO has an input coupled to the charge pump; and a feedback path coupled between an output of the VCO and an input of the phase detector that includes a loop switch that opens the feedback path in the test mode to prevent an output signal of the VCO from being coupled to the input of the phase detector.

11. The PLL circuit of claim 1, wherein:

the loop filter is formed in the same integrated circuit substrate as other portions of the PLL circuit.

12. A method of testing a PLL circuit, comprising the steps of:

enabling a test leg with a test signal to draw current through a load resistance of a PLL loop filter and generate a control voltage at an input of a voltage controlled oscillator;

varying the control voltage; and measuring the output frequency of the PLL for each of the different control voltages.

13. The method of claim 12, wherein:

the PLL circuit is formed in an integrated circuit; and enabling the test leg comprises turning on a transistor in response to a test signal applied from a source external to the integrated circuit.

14. The method of claim 12, wherein:

varying the control voltage includes providing a first test current of magnitude I to generate one control voltage, and providing currents having a multiple of I to generate a plurality of other control voltages.

15. The method of claim 12, wherein:

varying the control voltage includes outputting predetermined different phase difference values from a phase detector and generating test currents in response to each different phase difference value, and providing the different test currents to the loop filter.

16. The method of claim 12, wherein:

varying the control voltage includes opening a feedback loop of the PLL.

17. The method of claim 12, further including:

performing a linear regression on output frequency measurements and corresponding values used to vary the control voltage.

18. A phase locked loop (PLL) circuit, comprising:

a test loop filter that includes a load resistor coupled to a control voltage node and a test leg that provides a current path through the load resistor that is disabled in a non-test mode and enabled in a test mode; and a voltage controlled oscillator coupled to the test loop filter that generates an output signal having a frequency determined, at least in part, on a control voltage generated on the control voltage node.

19. The PLL circuit of claim 18, wherein:

the test loop filter includes a load resistor coupled in series with a first load capacitor and a switch element coupled between the load resistor and a power supply node.

20. The PLL circuit of claim 18, further including:

a variable supply current circuit that provides an output current to the test loop filter in a test mode that has a magnitude that can be varied in response to test signals.

* * * * *